United States Patent
Wang et al.

(10) Patent No.: US 9,087,845 B2
(45) Date of Patent: Jul. 21, 2015

(54) ELECTRICALLY CONDUCTIVE DEVICE AND MANUFACTURING METHOD THEREOF

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Xinpeng Wang, Shanghai (CN); Haiyang Zhang, Shanghai (CN)

(73) Assignees: SEMICONDUCTOR MANUFACTURING INTERNATIONAL CORPORATION (SHANGHAI) (CN); SEMICONDUCTOR MANUFACTURING INTERNATIONAL CORPORATION (BEIJING) (CN)

( * ) Notice: Subject to any disclaimer, the term of this patent is extended or adjusted under 35 U.S.C. 154(b) by 0 days.

(21) Appl. No.: 14/560,729

(22) Filed: Dec. 4, 2014

(65) Prior Publication Data

US 2015/0137370 A1 May 21, 2015

Related U.S. Application Data

(62) Division of application No. 13/664,317, filed on Oct. 30, 2012, now Pat. No. 8,932,950.

(30) Foreign Application Priority Data

Dec. 31, 2011 (CN) .......................... 2011 1 0459310

(51) Int. Cl.
*H01L 29/43* (2006.01)
*H01L 23/528* (2006.01)
*H01L 23/532* (2006.01)

(52) U.S. Cl.
CPC ...... *H01L 23/5283* (2013.01); *H01L 23/53276* (2013.01); *H01L 23/53295* (2013.01)

(58) Field of Classification Search
CPC ............ H01L 23/53276; H01L 21/768; H01L 21/76838; H01L 23/5226; H01L 2221/1094; C01B 31/04; B82B 3/00; B82Y 5/00; B82Y 10/00; B82Y 30/00; B82Y 40/00; C23C 18/1844; C23C 18/2086; C23C 18/40; C23C 18/44; C23C 18/1651; C23C 18/1692; C23C 18/20; C23C 18/28; C07K 14/17; B81B 2207/07
USPC ...................... 530/391.1, 400; 977/702–706, 977/720–722; 257/E21.585, E23.017; 438/610
See application file for complete search history.

(56) References Cited

U.S. PATENT DOCUMENTS

2004/0063915 A1  4/2004  Diner et al.
2006/0014203 A1*  1/2006  Watanabe et al. ................. 435/6
(Continued)

FOREIGN PATENT DOCUMENTS

CN   101208793 A   6/2008
CN   101264342 A   9/2008
(Continued)

OTHER PUBLICATIONS

Machine translation, Chuanbao Cao, Chinese Patent Publication No. CN 101264342, translation date: Mar. 16, 2015, EPO, all pages.*
(Continued)

*Primary Examiner* — Fernando L Toledo
*Assistant Examiner* — Victoria K Hall
(74) *Attorney, Agent, or Firm* — Innovation Counsel LLP

(57) ABSTRACT

An electrically conductive device and a manufacturing method thereof are provided. According to an exemplary embodiment, an electrically conductive device includes a graphene layer on a substrate, a protein tube portion on the graphene layer, and a conductor penetrating through the protein tube portion to the graphene layer, wherein the conductor is in electrical contact with the graphene layer.

8 Claims, 8 Drawing Sheets

(56) References Cited

U.S. PATENT DOCUMENTS

| | | | |
|---|---|---|---|
| 2006/0281306 A1* | 12/2006 | Gstrein et al. | 438/666 |
| 2007/0059727 A1 | 3/2007 | Deymier et al. | |
| 2008/0246148 A1 | 10/2008 | Won et al. | |
| 2011/0266675 A1 | 11/2011 | Deymier et al. | |
| 2014/0138829 A1 | 5/2014 | Zhao et al. | |

FOREIGN PATENT DOCUMENTS

| | | | |
|---|---|---|---|
| EP | 2362459 A1 | 8/2011 | |
| KR | 10-2011-0081519 A | 7/2011 | |
| WO | 2010097517 A2 | 9/2010 | |
| WO | WO 2010097517 * | 9/2010 | C01B 31/04 |

OTHER PUBLICATIONS

Machine translation, Kim, KR 10-2011-0081519 (translation date: Feb. 5, 2014), KIPO, all pages.

Yi Yang et al., "Nucleation and Growth of Microtubules from gamma-Tubulin-Functionalized Gold Surfaces", Jan. 7, 2006, American Chemical Society and American Institute of Chemical Engineers, Biotech. Prog. vol. 22, pp. 303-312.

Yong-Jin Han et al., "Mesoporous Silicate Sequestration and Release of Proteins", Oct. 13, 1999, American Chemical Society, J. Am. Chem. Soc. vol. 121, pp. 9897-9898.

Bartosz Trzaskowski et al., "Metallization of nanobiostructures: a theoretical study of copper nanowires growth in microtubules", Oct. 12, 2006, Royal Society of Chemistry, J. Mater. Chem. vol. 16, pp. 4649-6456.

K. Valenzuela et al., "Formation of Copper Nanowires by Electroless Deposition Using Microtubules as Templates", 2008, American Scientific Publishers, J. Nanoscience & Nanotech. vol. 8, pp. 1-6.

Cecilia Conde & Alfredo Caceres, "Microtubule assembly, organization and dynamics in axons and dendrites", May 2009, Neuroscience, Nature Reviews, vol. 10, pp. 319-332.

Yi Yang, "Study of Microtubule Templates for Fabrication of Nano-Interconnects" (doctoral thesis), 2005, University of Arizona, UMI Dissertations Publishing, all pages.

A. Naeemi, et al., "Performance Benchmarking for Graphene Nanoribbon, Carbon Nanotube, and Cu Interconnect", IITC, 987-1-4244-1911-1/08IEEE, pp. 183-185,2008.

A. Reina, et al., "Large Area Few-Layer Graphene Films on Arbitrary Substrates by Chemical Vapor Deposition", Nano Letters, vol. 9, No. 1, pp. 31-35,2009.

* cited by examiner

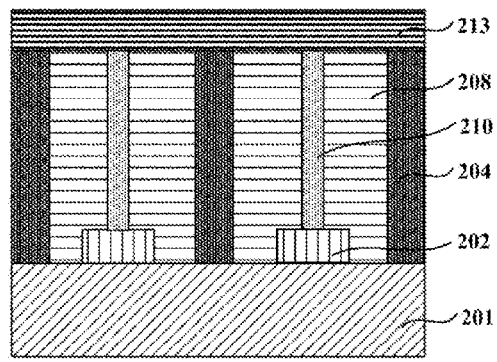
FIG. 2M
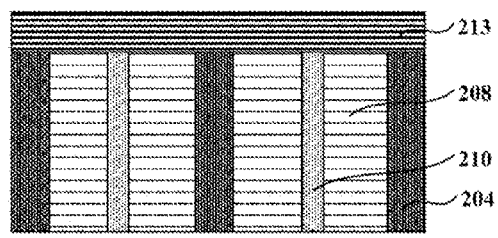
FIG. 2N
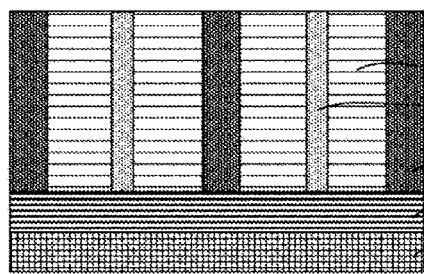     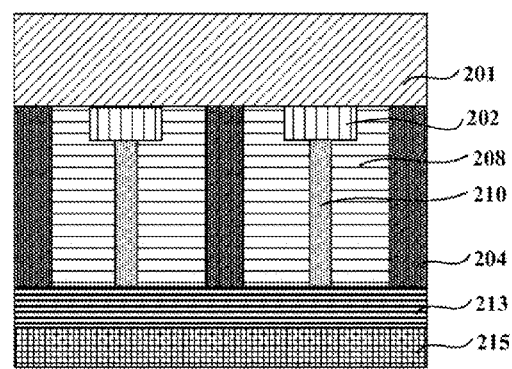
FIG. 2O            FIG. 2Q

ELECTRICALLY CONDUCTIVE DEVICE AND MANUFACTURING METHOD THEREOF

CROSS-REFERENCE TO RELATED APPLICATIONS

This application is a divisional application of U.S. application Ser. No. 13/664,317 filed Oct. 30, 2012, which application claims priority to Chinese Patent Application No. 201110459310.6, filed on Dec. 31, 2011, and entitled "Semiconductor Device and Manufacturing Method thereof", both of which are incorporated herein by reference.

BACKGROUND

1. Field of the Invention

The present disclosure relates to the field of semiconductor technology, and more specifically, to a electrically conductive device and a manufacturing method thereof.

2. Description of the Related Art

Graphene is one of the currently known materials having the highest electrical conductivity. The velocity of electrons in graphene can be 1/300 of the speed of light, which is far beyond the velocity of electrons in common conductors. As a result, graphene has been considered one of the most promising materials for conductive interconnects in the field of semiconductors.

FIG. 1 schematically shows a diagram of a conductive interconnecting structure for a semiconductor device in the prior art.

Horizontal conductive connecting lines 102 are formed on a substrate 101. The horizontal conductive connecting lines 102 are generally metal connecting lines. The horizontal conductive connecting lines 102 can have a patterned structure. On the horizontal conductive connecting lines 102, a dielectric material layer 103 and vertical conductive connecting lines 104 penetrating through the dielectric material layer 103 are formed.

The vertical conductive connecting lines 104 are formed as follows: firstly, etching the dielectric material layer 103 to form longitudinal vias through the dielectric material layer 103; and then, depositing conductive materials into the vias so as to form the vertical conductive connecting lines 104. The vertical conductive connecting lines 104 are in electrical contact with the horizontal conductive connecting lines 102.

Graphene layers have been used for conductive interconnects (see, non-patent document, "Performance Benchmarking for Graphene Nanoribbon, Carbon Nanotube, and Cu Interconnect", Azad Naeemi and James D. Meindl, IITC, 2008, p 183-185, which is incorporated herein by reference in its entirety). This document has pointed out that, graphene nanoribbon with a thickness of an order of atomic layer has been successfully prepared. The resistivity of the graphene nanoribbon is smaller than the resistivity of copper conductor.

SUMMARY

According to one aspect, an electrically conductive device is provided that includes: a graphene layer on a substrate; a protein tube portion on the graphene layer and a conductor penetrating through the protein tube portion to the graphene layer, wherein the conductor is in electrical contact with the graphene layer.

The graphene layer may have a patterned structure serving as conductive interconnects connecting components in a semiconductor device.

The electrically conductive device may further include a dummy dielectric material layer, wherein the dummy dielectric material layer surrounds the protein tube portion.

The dummy dielectric material layer include an oxide, silicon carbide, or N-doped silicon carbide, and the dummy dielectric material layer has a width of 10 nm to 100 nm and a thickness of 10 nm to 3000 nm.

A plurality of composite units may be stacked on the substrate, each including the graphene layer, the protein tube portion, the conductor and the dummy dielectric material layer, and the graphene layer in an upper composite unit is in electrical contact with the conductor in a lower composite unit.

The graphene layer may be in electrical contact with an exposed conductive element on the substrate.

The graphene layer may have a thickness of 12 atomic layers or less.

The dummy dielectric material layer may be flush with the protein tube portion.

An advantage of the present disclosure is that, the graphene layer is protected from being damaged because the protein tube portion and the conductor penetrating through the protein tube portion are formed on the graphene layer with the conductor in electrical contact with the graphene layer, and no etching is employed during the formation of the protein tube portion and the conductor.

Further features and advantages thereof will become apparent from the following detailed description of example embodiments according to the present disclosure with reference to the attached drawings.

BRIEF DESCRIPTION OF THE DRAWINGS

The accompanying drawings, which are incorporated in and constitute a part of the specification, illustrate embodiments of the disclosure and, together with the description, serve to explain the principles of the disclosure.

The present disclosure can be better understood by reading the following detailed description with reference to the accompanying drawings, in which.

DETAILED DESCRIPTION

Figure 1:
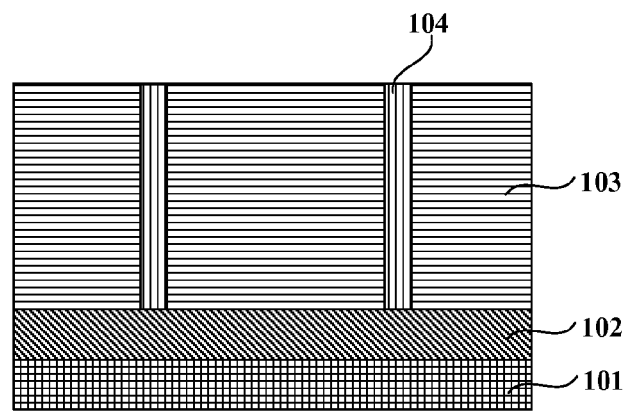
FIG. 1 is a diagram showing a conventional interconnecting conductive structure for use in a semiconductor device.

Various example embodiments will now be described in detail with reference to the drawings. It should be noted that the relative arrangement of the components and steps, the numerical expressions, and numerical values set forth in these embodiments do not limit the scope of the present disclosure unless it is specifically stated otherwise.

It should be understood that, for the convenience of description, each component in the figures has not necessarily been drawn to scale.

The following description of at least one example embodiment is merely illustrative in nature and is in no way intended to limit the disclosure, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the example embodiments could have different values.

Similar reference numerals and letters refer to similar items in the following figures, and thus once an item is defined in one figure, it is possible that it need not be further discussed for following figures.

The applicant has found that, if a graphene layer is selected to replace traditional horizontal conductive connecting lines, the graphene layer is easily damaged during the formation of the dielectric material layer and the vertical conductive connecting lines.

While not wishing to be bound by any particular theory, it is though that the damage to the graphene layer is due to the fact that the dielectric material layer has to be etched to form longitudinal vias. This etching is very likely the source of the damage to the graphene layer because the graphene layer has a thickness of only several atomic layers. Thus the application of graphene on semiconductor devices as conductive connecting lines using conventional methods is significantly limited.

Figure 2A:
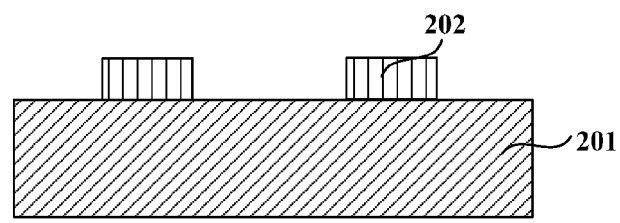
FIGS. 2A to 2Q schematically show stages of a process for manufacturing a device having an interconnecting conductive structure according to an example embodiment.
Figure 2P:
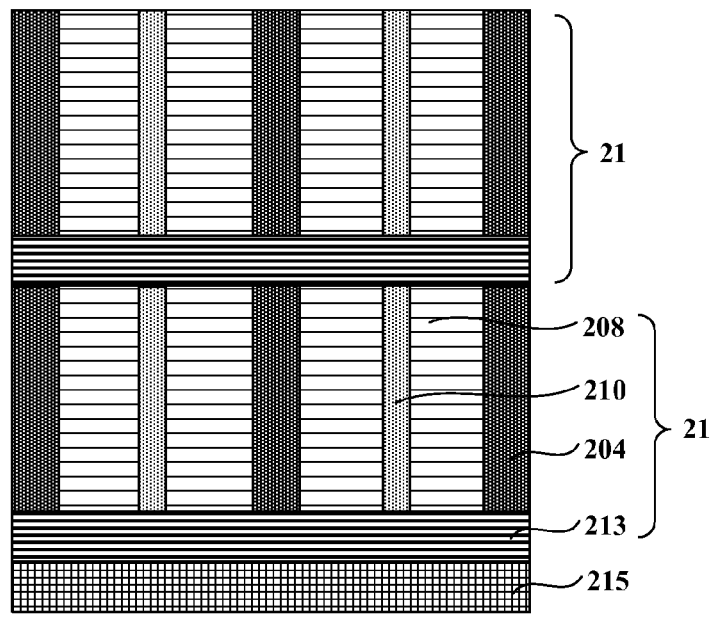
Figure 3:
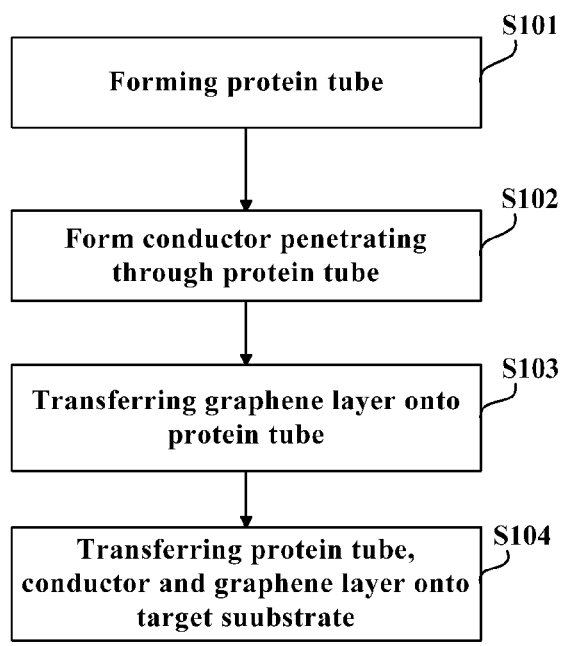
FIG. 3 is a flowchart showing a method for manufacturing a device according to an example embodiment.

Below, with reference to FIGS. 2A to 2P and FIG. 3, a method for manufacturing a device having an interconnecting conductive structure that includes a graphene layer, according to an example embodiment will be described. FIG. 3 is a flowchart showing a method for manufacturing a device having an interconnecting conductive structure that includes a graphene layer, according to an example embodiment. FIGS. 2A to 2P are cross-sectional views, which schematically show stages of a specific process for implementing the steps of FIG. 3 in an example embodiment. One of ordinary skill in the art will understand that the steps of FIG. 3 can also be implemented in other ways.

At step S101, a protein tube portion is formed.

A plurality of protein tubes can be formed simultaneously. The protein tube(s) can be formed by the following method.

A gamma tubulin layer 202 is formed on a first substrate 201, as shown in FIG. 2A.

The gamma tubulin layer 202 may cover only a portion of the first substrate 201. FIG. 2A shows two gamma tubulin layers 202, but the number of the gamma tubulin layers is not limited to two.

Figure 2B:
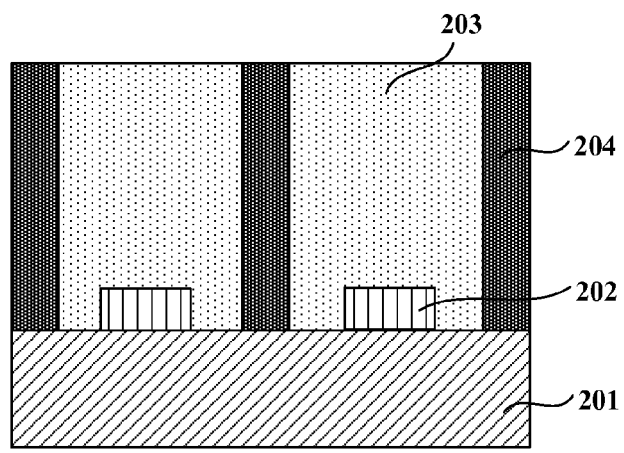

An ultra-low-k material layer 203 and a dummy dielectric material layer 204 are deposited on the first substrate 201, as shown in FIG. 2B.

The ultra-low-k material layer 203 can be formed first to cover the gamma tubulin layer 202.

Then, the dummy dielectric material layer 204 is formed. The dummy dielectric material layer 204 can surround the ultra-low-k material layer 203, and be flush (i.e., have top surfaces that are even) with the ultra-low-k material layer 203.

The dummy dielectric material 204 is disposed around the ultra-low-k material layer 203 and can be used for support.

The dummy dielectric material layer 204 can have a size selected as needed, for example, having a width of 10 nm to 100 nm and a thickness of 10 nm to 3000 nm. The material used for the dummy dielectric material layer 204 may include, for example, oxide, silicon carbide, or N-doped silicon carbide.

The dummy dielectric material layer 204 may, alternatively, be deposited first and then be etched to form gap(s) with a certain size, and thereafter, the ultra-low-k material layer 203 is formed in the gap(s). A planarization processing can be performed on the top surfaces of the dummy dielectric material layer 204 and the ultra-low-k material layer 203 by using, for example, a chemical mechanical polishing method.

Figure 2C:
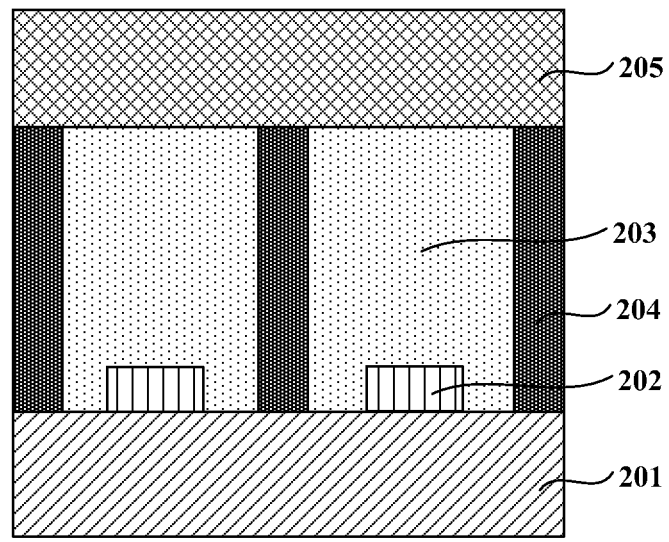

A molecular sieve 205 is formed on the upper surfaces of the ultra-low-k material layer 203 and the dummy material layer 204, as shown in FIG. 2C.

Technologies known in the art can be employed for the process of forming a molecular sieve; for example, see the non-patent document, "Synthesis and Characterization of Novel Mesoporous Molecular Sieve MCM-41", He Jing, Sun Peng, Duan Xue, Li Chengyue, Chemistry (ISSN 0441-3776), Vol. 3, p 29-36, 1999, which is incorporated herein by reference in its entirety.

Figure 2D:
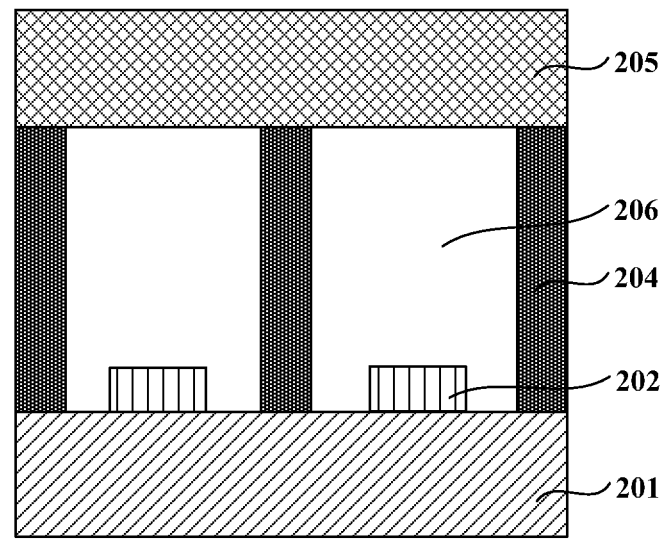

The ultra-low-k material layer 204 is removed by ashing, so as to form a cavity 206, as shown in FIG. 2D.

Figure 2E:
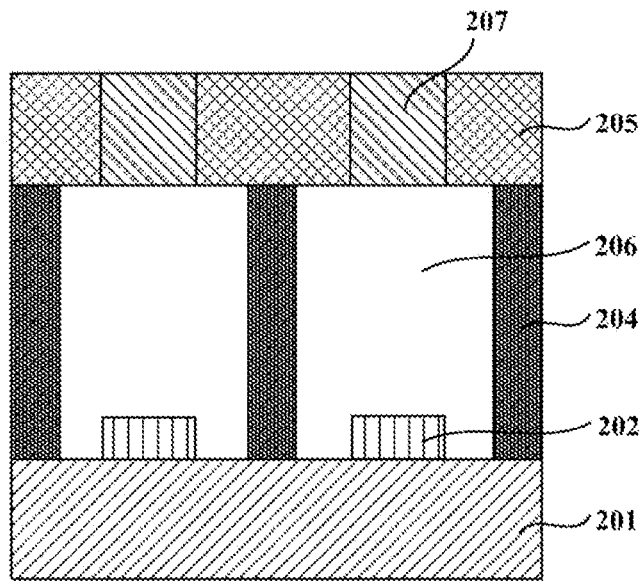

The polypeptide 207 is imprinted into the molecular sieve such that the polypeptide 207 is directly above the gamma tubulin layer 204, thereby forming a first structure on the first substrate 201, as shown in FIG. 2E.

The polypeptide 207 imprinted into the molecular sieve 205 can be replaced with other peptide-like materials or other suitable materials.

Figure 2F:
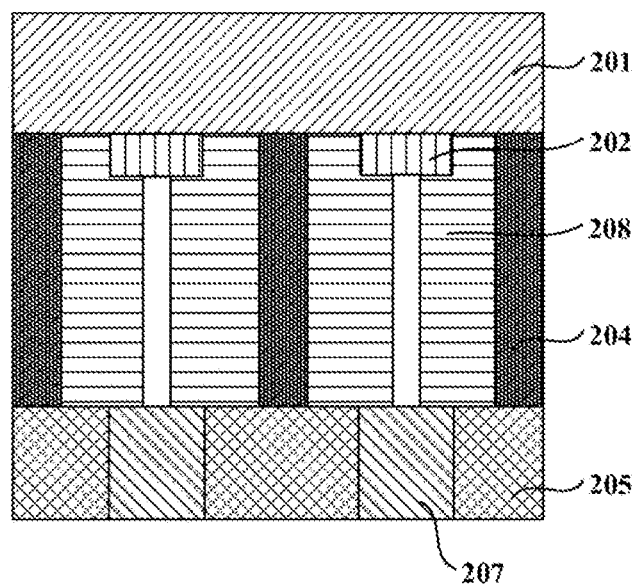

As shown in FIG. 2F, the first structure is inverted and then (not shown) immersed into a protein solution. Protein then enters the cavity 206 from the protein solution, and a protein tube portion 208 is formed that extends from the gamma tubulin layer 202 to the polypeptide 207, as shown in FIG. 2F. The protein in the protein tube portion 208 serves as a dielectric material.

At step S102, a conductor penetrating through the protein tube portion is formed.

The conductor 210 can be formed as follows.

Figure 2G:
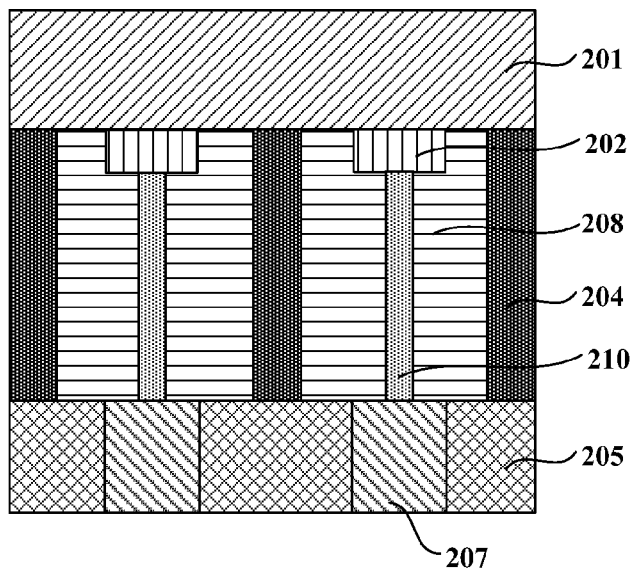

The structure is immersed into a metal salt solution to immerse the protein tube portion 208 into the metal salt solution, so as to form the conductor 210, as shown in FIG. 2G, penetrating through the protein tube portion 208.

For example, the protein tube portion can be immersed into a copper salt solution, thereby forming a copper conductor penetrating through the protein tube portion.

Figure 2H:
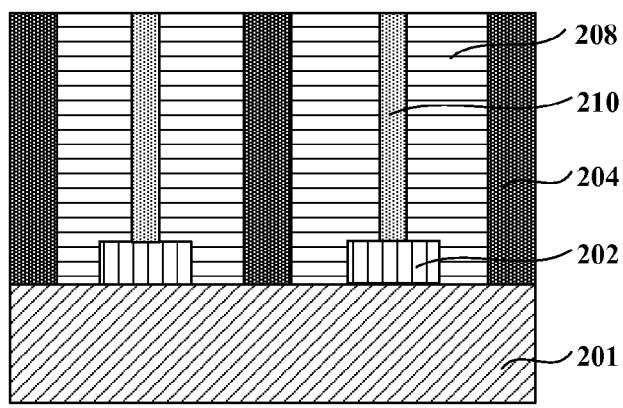

Then the molecular sieve 205 and the imprinted polypeptide 207 are removed, until a first surface of the protein tube portion 208 is exposed, as shown in FIG. 2H.

At step S103, a graphene layer is transferred onto the protein tube portion such that the graphene layer is in electrical contact with the conductor.

The formed graphene layer can have a patterned structure, serving as conductive interconnects in the device.

The following method can be employed for forming the graphene layer and transferring the graphene layer onto the protein tube portion.

Figure 2I:
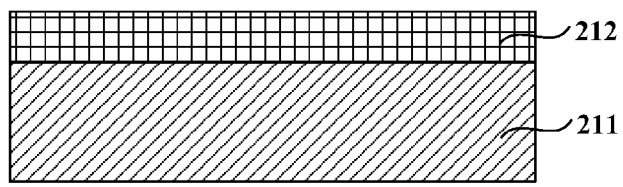

A nickel layer 212 is formed on a second substrate 211, as shown in FIG. 2I.

The nickel layer can have a patterned structure (not shown in the figure). One of ordinary skill in the art will understand that, different patterned structures can be formed on the nickel layer according to needs of the device.

Figure 2J:
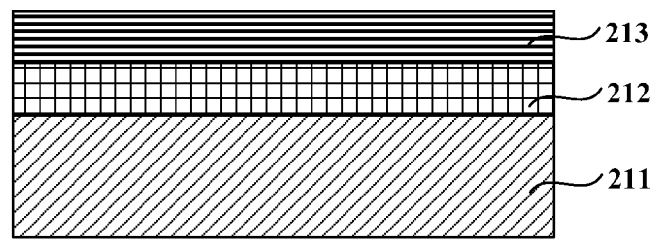

The graphene layer 213 is formed on the patterned nickel layer 212, as shown in FIG. 2J.

The graphene layer 213 is not limited to being formed on the nickel layer, but can also be formed on other suitable materials as needed, such as, for example, on a cobalt layer, a platinum layer, an iridium layer or a ruthenium layer.

The graphene layer 213 can be prepared by, for example, a chemical vapour deposition method.

The graphene layer 213 can have a thickness of one atomic layer or multiple atomic layers. For example, a graphene layer can be formed to have a thickness of 12 atomic layers.

The formed graphene layer 213 can have the same patterned structure as the nickel layer 212.

Moreover, the patterns on the graphene layer 213 can be formed by photolithography.

Figure 2K:
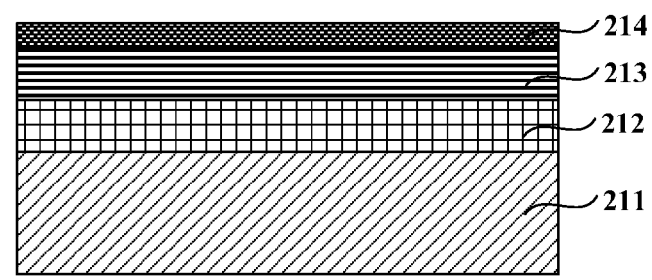

A protective layer 214 is formed on the surface of the graphene layer 213, as shown in FIG. 2K.

Figure 2L:
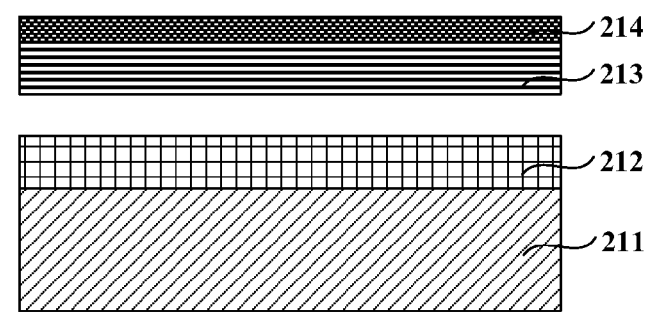

The protective layer may be formed on the surface of the graphene layer by, for example, spin-coating. The protective layer can be, for example, poly[methyl methacrylate], PMMA) or any other suitable material The nickel layer 212 is wet-etched to separate the graphene layer 213 from the second substrate 211, as shown in FIG. 2L.

For example, an HCL (hydrochloric acid) wet etching process may be employed to etch the nickel layer 212.

The graphene layer 213 and the protective layer 214 are transferred onto the first surface of the protein tube portion 208 such that the graphene layer 213 is in electrical contact with the conductor 210. Then, the protective layer 214 on the surface of the graphene layer 213 is removed, as shown in FIG. 2M.

Regarding the formation and transferring process of the graphene layer, reference can be made to the non-patent document, "Large Area Few-Layer Graphene Films on Arbitrary Substrates by Chemical Vapour Deposition", Alfonso Reina, Xiaoting Jia, John Ho, et al, Nano letters, Vol. 9, No. 1, p 31-35, 2009, which is incorporated herein by reference in its entirety.

At step S104, the protein tube portion, the conductor and the graphene layer are transferred onto the target substrate.

The graphene layer is thus in electrical contact with an exposed conductive element on the target substrate.

The protein tube portion, the conductor and the graphene layer can be transferred onto the target substrate by employing the following method.

The gamma tubulin layer 202 and the first substrate 201 are removed, as shown in FIG. 2N.

The protein tube portion 208, the conductor 210 and the graphene layer 213 are again inverted, and then transferred onto the target substrate 215, such that the graphene layer 213 is in electrical contact with an exposed conductive element (not shown) on the target substrate 215, as shown in FIG. 2O.

A planarization processing may be performed on the side of the protein tube portion 208, the conductor 210 and the dummy dielectric material layer 204 that is opposite to the target substrate 215.

Alternatively, the protein tube portion 208, the conductor 210, the graphene layer 213, the gamma tubulin layer 202 and the first substrate 201 can be transferred onto the target substrate 215 first, such that the graphene layer 213 is in electrical contact with the exposed conductive element on the target substrate 215, such as shown in FIG. 2Q. Then, the gamma tubulin layer 202 and the first substrate 201 are removed, and a planarization processing is performed on the side of the protein tube portion 208, the conductor 210 and the dummy dielectric material 204 that is opposite to the target substrate 215.

A plurality of composite units 21 can be formed on the target substrate 215, as shown in FIG. 2P.

Each composite unit 21 can include the graphene layer 213, the protein tube portion 208, the conductor 210 and the dummy dielectric material layer 204.

Here, the graphene layer 213 serves as the conductive interconnects in a device, which may be, for instance, a semiconductor device. The device having an interconnecting conductive structure as disclosed herein may be used, for example, in various semiconductor devices to electrically connect components within the semiconductor device. Such components may include, for example, thin film transistors, The graphene layer 213 in an upper composite unit is in electrical contact with the conductor 210 in a lower composite unit, thereby achieving an electrical connection between the upper and lower graphene layers.

In the example embodiments of the present disclosure, the protein tube portion and the conductor are formed on the graphene layer. The conductor can be in electrical contact with the graphene layer. In such a way, the graphene layer can serve as horizontal conductive connecting lines in the device. The conductor in the protein tube portion can serve as a vertical conductive connecting line in the device. Because etching is unnecessary during the formation of the conductor in the protein tube portion, the graphene layer can be protected from being damaged by etching.

Figure 4:
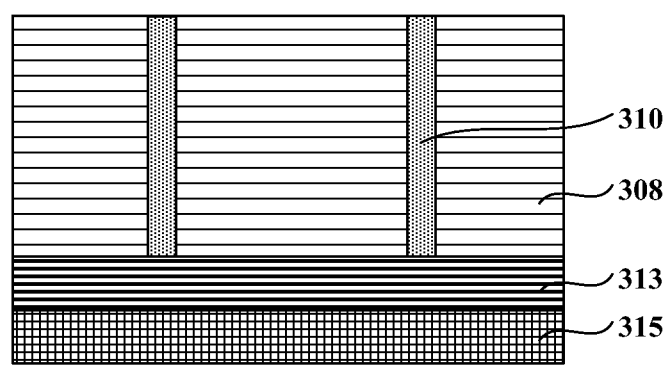
FIG. 4 shows a structural diagram of a device manufactured according to an example embodiment of the present invention.

Below, with reference to FIG. 4, the structural diagram of a device having a interconnecting conductive structure, according to an example embodiment of is described. The device can be formed by using the method shown in FIG. 3, or can be formed using other suitable methods.

The device comprises a graphene layer 313 on a substrate 315, a protein tube portion 308 and a conductor 310 that penetrates through the protein tube portion 308 on the graphene layer 313. The conductor 310 is in electrical contact with the graphene layer 313.

The graphene layer 313 can have a patterned structure (not shown in the figure), serving as conductive interconnects in the semiconductor device.

A plurality of protein tubes in protein tube portion 308 and conductors 310 can be provided on the graphene layer 313, and the number of the protein tube portions 308 and the conductors 310 is not limited to that shown in the figures.

Below, with reference to FIG. 2P, a device having interconnecting conductive structure manufactured by a method according to another example embodiment is described.

Two composite units 21 are formed on the substrate 215. Each composite unit 21 includes the graphene layer 213, the protein tube portion 208, the conductor 210 and the dummy dielectric material layer 204.

The dummy dielectric material layer 204 surrounds the protein tube portion 208 and is flush with the protein tube portion 208. The material used for the dummy dielectric material layer 204 may be, for example, an oxide, silicon carbide, or N-doped silicon carbide, and the dummy dielectric material layer 204 can have a width (i.e., across the layer in the horizontal direction of FIG. 2P) of 10 nm to 100 nm and a thickness (i.e., a depth in the vertical direction of FIG. 2P) of 10 nm to 3000 nm.

The graphene layer 213 can have a patterned structure, serving as conductive interconnects in a semiconductor device.

The graphene layer 213 in an upper composite unit is in electric contact with the conductor 210 in a lower composite unit, thereby achieving an electrical connection between the graphene layers 213 in two composite units.

The number of the composite unit 21 is not limited to two, and multiple composite units can be formed on the substrate as needed.

A method for manufacturing a device having an interconnecting conductive structure, for use, for instance, in a semiconductor device, according to the present disclosure as well as the manufactured of such device has been described above in detail. In order to not obscure the concept of the present disclosure, some details known to persons of ordinary skill in the relevant art are not described.

Although some specific example embodiments of the present disclosure have been described above by way of examples, one of ordinary skill in the art should appreciate that, these embodiments are merely illustrative but are not intended to limit the scope of the present disclosure. Moreover, one of ordinary skill in the art knows that various modifications can be made to the embodiments, without departing from the scope of the present disclosure, including the attached claims.

What is claimed is:

1. An electrically conductive device comprising:
   a graphene layer on a substrate;
   a protein tube portion on the graphene layer; and
   a conductor penetrating through the protein tube portion to the graphene layer, wherein the conductor is in electrical contact with the graphene layer.

2. The electrically conductive device according to claim 1, wherein the graphene layer includes a patterned structure serving as conductive interconnects connecting components in a semiconductor device.

3. The electrically conductive device according to claim 1, further comprising a dummy dielectric material layer, wherein the dummy dielectric material layer surrounds the protein tube portion.

4. The electrically conductive device according to claim 3, wherein the dummy dielectric material layer includes at least one of oxide, silicon carbide, and N-doped silicon carbide, and the dummy dielectric material layer has a width of 10 nm to 100 nm and a thickness of 10 nm to 3000 nm.

5. The electrically conductive device according to claim 3, wherein a plurality of composite units are stacked on the substrate, each composite unit including the graphene layer, the protein tube portion, the conductor and the dummy dielectric material layer, and the graphene layer in an upper composite unit is in electrical contact with the conductor in a lower composite unit.

6. The electrically conductive device according to claim 1, wherein the graphene layer is in electrical contact with an exposed conductive element on the substrate.

7. The electrically conductive device according to claim 1, wherein the graphene layer has a thickness of 12 atomic layers or less.

8. The electrically conductive device according to claim 3, wherein an end surface of the dummy dielectric material layer is flush with an end surface of the protein tube portion.

\* \* \* \* \*